US008708729B2

(12) United States Patent
An et al.

(10) Patent No.: US 8,708,729 B2
(45) Date of Patent: Apr. 29, 2014

(54) ELECTRICAL CONNECTOR ASSEMBLY HAVING INDEPENDENT LOADING MECHANISM FACILITATING INTERCONNECTIONS FOR BOTH CPU AND CABLE

(75) Inventors: Alex Lon An, San Jose, CA (US); Darrell Lynn Wertz, Chandler, AZ (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 127 days.

(21) Appl. No.: 13/526,540

(22) Filed: Jun. 19, 2012

(65) Prior Publication Data
US 2013/0337664 A1    Dec. 19, 2013

(51) Int. Cl.
*H01R 12/00* (2006.01)
(52) U.S. Cl.
USPC ........................................... 439/331; 439/372
(58) Field of Classification Search
USPC ....................................... 439/67, 70, 331, 372
See application file for complete search history.

(56) References Cited

U.S. PATENT DOCUMENTS

| | | | | |
|---|---|---|---|---|
| 3,567,999 A * | 3/1971 | Larson et al. | .................. | 361/767 |
| 4,023,878 A * | 5/1977 | Hennessey | ...................... | 439/65 |
| 4,068,915 A * | 1/1978 | Evans | ........................... | 439/637 |
| 4,084,869 A * | 4/1978 | Yen | ................................. | 439/70 |
| 4,519,658 A * | 5/1985 | Biswas | ........................... | 439/68 |
| 4,554,505 A * | 11/1985 | Zachry | ..................... | 324/750.25 |
| 4,639,058 A * | 1/1987 | Morgan | ........................... | 439/68 |
| 4,676,564 A * | 6/1987 | Mitchell, Jr. | .................... | 439/77 |
| 4,814,857 A * | 3/1989 | Werbizky | ....................... | 174/260 |
| 4,846,705 A * | 7/1989 | Brunnenmeyer | ............... | 439/78 |
| 4,872,843 A * | 10/1989 | Anstey | ............................ | 439/69 |
| 4,912,401 A * | 3/1990 | Nady et al. | ............... | 324/756.05 |
| 5,136,471 A * | 8/1992 | Inasaka | ......................... | 361/794 |
| 5,148,354 A * | 9/1992 | Roth | ............................. | 361/760 |
| 5,176,524 A * | 1/1993 | Mizuno et al. | ................. | 439/68 |
| 5,273,440 A * | 12/1993 | Ashman et al. | ................ | 439/71 |
| 5,276,817 A * | 1/1994 | Matschke et al. | ............... | 439/61 |
| 5,358,412 A * | 10/1994 | Maurinus et al. | .............. | 439/66 |
| 5,360,353 A * | 11/1994 | Kinoshita | ............... | 439/620.09 |
| 5,383,787 A * | 1/1995 | Switky et al. | ................... | 439/67 |
| 5,487,673 A * | 1/1996 | Hurtarte | ......................... | 439/69 |
| 5,521,992 A * | 5/1996 | Chun et al. | ..................... | 385/14 |
| 5,530,291 A * | 6/1996 | Chan et al. | .................... | 257/723 |
| 5,610,801 A * | 3/1997 | Begis | ............................ | 361/784 |
| 5,859,538 A * | 1/1999 | Self | ......................... | 324/754.07 |
| 5,980,267 A * | 11/1999 | Ayers et al. | ..................... | 439/60 |
| 6,130,444 A * | 10/2000 | Hashizume et al. | ........... | 257/81 |
| 6,144,559 A * | 11/2000 | Johnson et al. | ............... | 361/760 |
| 6,336,816 B1 * | 1/2002 | Yatskov et al. | ................. | 439/67 |
| 6,540,527 B1 * | 4/2003 | Tamarkin | ........................ | 439/67 |
| 6,592,380 B2 * | 7/2003 | Miyazawa et al. | ............. | 439/67 |
| 6,612,851 B1 * | 9/2003 | Goodwin et al. | ............... | 439/66 |

(Continued)

*Primary Examiner* — Neil Abrams
(74) *Attorney, Agent, or Firm* — Wei Te Chung; Ming Chieh Chang (57) ABSTRACT

An electrical connector assembly (100) includes an electrical connector, a CPU (5) assembled to the electrical connector and a pair of cable connector assembles (7) assembled to two opposite sides of the CPU (5), each of the cable connector assembly (7) includes a cable connector (71) assembled to the CPU (5) and a cable (72) assembled to the cable connector (71), the electrical connector includes a first load lever (4) with a first press portion (420) pressing one of the cables (72) and a second load lever (3) with a second press portion (320) pressing the other of the cables (72).

20 Claims, 6 Drawing Sheets

(56) References Cited

U.S. PATENT DOCUMENTS

| | | | |
|---|---|---|---|
| 6,638,080 B2 * | 10/2003 | Johnson et al. | 439/77 |
| 6,659,802 B1 * | 12/2003 | Lwee | 439/630 |
| 6,906,407 B2 * | 6/2005 | Byers et al. | 257/686 |
| 6,916,183 B2 * | 7/2005 | Alger et al. | 439/69 |
| 6,969,270 B2 * | 11/2005 | Renfro et al. | 439/342 |
| 6,971,887 B1 * | 12/2005 | Trobough | 439/71 |
| 7,153,144 B2 * | 12/2006 | Ohsawa et al. | 439/67 |
| 7,248,481 B2 * | 7/2007 | Trobough | 361/785 |
| 7,411,282 B2 * | 8/2008 | Furuyama et al. | 257/678 |
| 7,473,134 B2 * | 1/2009 | Zhang | 439/607.01 |
| 7,489,514 B2 * | 2/2009 | Hamasaki et al. | 361/721 |
| 7,517,228 B2 * | 4/2009 | Baskaran et al. | 439/67 |
| 7,667,311 B2 * | 2/2010 | Furuyama et al. | 257/678 |
| 7,667,982 B2 * | 2/2010 | Hamasaki et al. | 361/803 |
| 7,891,988 B2 * | 2/2011 | Dittmann et al. | 439/77 |
| 8,450,201 B2 * | 5/2013 | Braunisch et al. | 438/599 |
| 2006/0035510 A1 * | 2/2006 | Numata et al. | 439/372 |
| 2006/0228922 A1 * | 10/2006 | Morriss | 439/171 |
| 2007/0160078 A1 * | 7/2007 | Chen et al. | 370/463 |
| 2009/0023330 A1 | 1/2009 | Stoner et al. | |
| 2011/0287639 A1 | 11/2011 | Hsu | |

* cited by examiner

FIG. 6

# ELECTRICAL CONNECTOR ASSEMBLY HAVING INDEPENDENT LOADING MECHANISM FACILITATING INTERCONNECTIONS FOR BOTH CPU AND CABLE

BACKGROUND OF THE INVENTION

1. Field of the Invention

The present invention relates to an electrical connector assembly and the electrical connector thereof, and more particularly to an electrical connector assembly incorporated with an independent loading mechanism facilitating simultaneously at least two independent interconnections between a CPU with respect to a cable which being seated on the CPU and between the CPU with respect to an electrical connector that the CPU being seated on.

2. Description of Related Art

U.S. publication No. 20090023330 published to stoner on Jan. 22, 2009 discloses a conventional electrical connector assembly to use a cable to establish a connection path between two CPUs. The cable is assembled to a cable connector, and the cable connector is assembled to the CPUs. The CPU comprises a plurality of conductive pads on an upper surface thereof. The cable connector comprises a plurality of contacts electrically connecting with the conductive pads of the CPU.

The cable connector comprises a plurality of posts, and the CPU comprises a plurality of holes corresponding to the posts. When the cable connector is assembled to the CPU, the posts are received in the holes to position the cable connector on the CPU. The posts received in the holes can only position the cable connector on the CPU, because there is no loading force on the upper surface of the cable connector, when there is a force exert on the cable connector, the contacts of the cable connector and the conductive pads of the CPU is easy to be disconnected from each other. Thus, the electrical connection between the cable connector and the CPU is instability.

Hence, it is desirable to provide an improved electrical connector assembly with a loading mechanism to overcome the aforementioned disadvantages.

SUMMARY OF THE INVENTION

Accordingly, an object of the present invention is to provide an electrical connector assembly and an electrical connector thereof with a loading mechanism for pressing a cable against a CPU to simultaneously achieve electrical connection between the cable and the CPU and electrical connection between the CPU and a electrical connector that the CPU seats on.

According to one aspect of the present invention, an electrical connector assembly comprises an electrical connector, a CPU assembled to the electrical connector and a pair of cable connector assembles assembled to the two opposite sides of the CPU, each of the cable connector assembly comprises a cable connector assembled to the CPU and a cable assembled to the cable connector, the electrical connector comprises a first load lever with a first press portion pressing one of the cables and a second load lever with a second press portion pressing the other of the cables.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
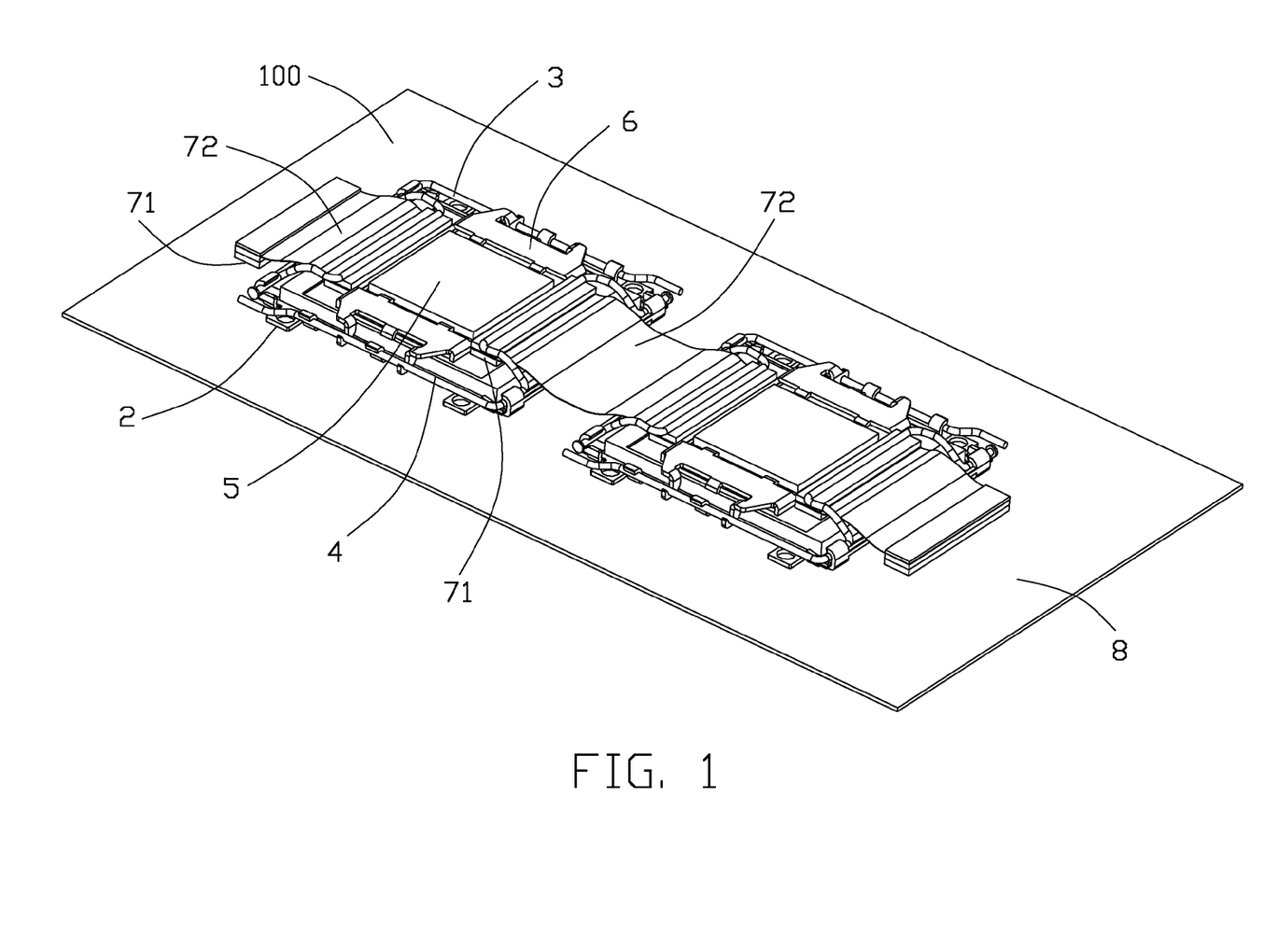
FIG. 1 is an assembled, isometric view of a preferred embodiment of an electrical connector assembly, showing a cable connecting with two CPUs seating on two electrical connector.
Figure 2:
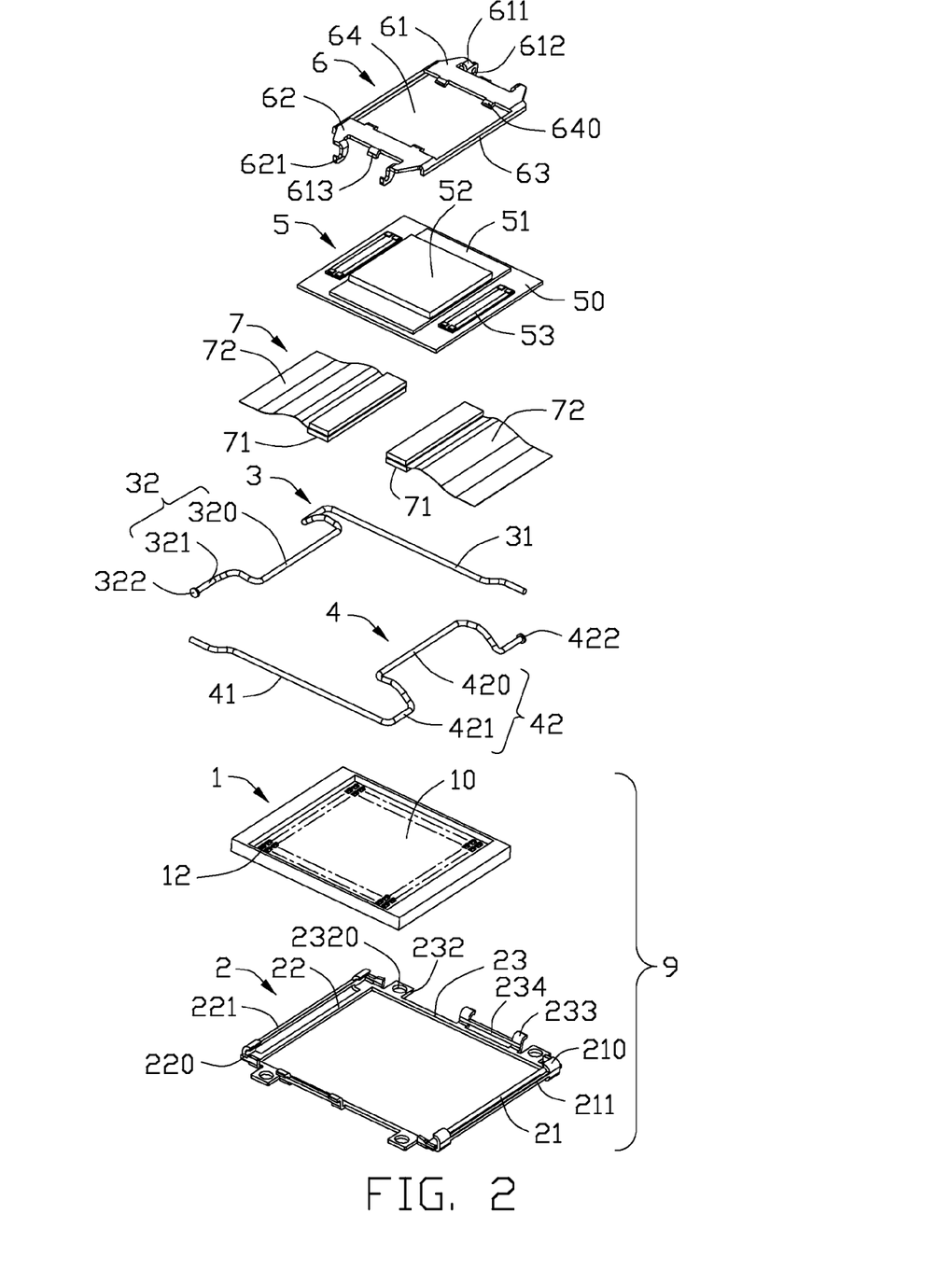
FIG. 2 is an exploded, perspective view of the electrical connector assembly shown in FIG. 1.

FIGS. 1 to 2 illustrate an electrical connector assembly 100 in accordance to a preferred embodiment of the present invention, the electrical connector assembly 100 is used for electrically connecting a central processing unit (CPU) 5 with a printed circuit board (PCB) 8 and achieves high-speed signal transmissions between two CPUs 5 through cable 72. The electrical connector assembly 100 comprises an electrical connector (not labeled), a CPU 5 assembled to the electrical connector and a cable connector assembly 7 assembled to the CPU 5.

The electrical connector comprises a housing assembly 9, a first load lever 4 and a second load lever 3 locating on two opposite sides of the housing assembly 9 and a cover 6 assembled to the first load lever 4 and the second load lever 3. The housing assembly 9 comprises an insulative housing 1 with a plurality of contacts 12 received therein, a stiffener 2 surrounding the insulative housing 1. The first load lever 4 and the second load lever 3 are assembled to two ends of the stiffener 2. The insulative housing 1 defines a cavity 10 for receiving the CPU 5.

The stiffener 2 comprises a first end 21, a second end 22 and a pair of third ends 23 connecting the first end 21 and the second end 22. The first end 21 comprises a pair of first holding portions 210 extending upwardly and curvedly from the first end 21 and a first connecting portion 211 connecting the pair of first holding portions 220. The first connecting portion 211 is used to strength the pair of first holding portions 210. The second end 22 comprises a pair of second holding portions 220 extending upwardly and curvedly from the second end 21 and a second connecting portion 221 connecting the pair of second holding portions 220. The second connecting portion 221 is used to strength the pair of second holding portions 220. The third end 23 comprises a pair of positioning portions 232 extending outwardly from the third end 23, a pair of interlock portions 233 extending upwardly and curvedly from the third end 23 and a third connecting portion 234 connecting the pair of interlock portions 233. Each of the positioning portions 232 defines a hole 2320. The third connecting portion 234 is used to strength the pair of interlock portions 233. The electrical connector is positioned to the PCB 8 by a positioning member (not shown) going through the hole 2320.

The first load lever 4 comprises a first operation portion 41, a first locating portion 42 connecting with the first operation portion 41 and a first stop portion 422 at the end of the first locating portion 42. The first locating portion 42 comprises a first press portion 420 in the middle thereof and a pair of first retention portions 421 at the two sides of the first press portion 420. When the first load lever 4 is assembled to the stiffener 2 and in a closed position, the pair of first retention portions 42 interlocks with the pair of first holding portions 210 of the stiffener 2, the first stop portion 422 is thicker than the first retention portion 421 to prevent the horizontal movement of the first load lever 4. Thus, the first load lever 4 is securely positioned on the stiffener 2.

The second load lever 3 has a same structure with the first load lever 4 and comprises a second operation portion 31, a second locating portion 32 connecting with the second operation portion 31 and a second stop portion 322 at the end of the second locating portion 32. The second locating portion 32 comprises a second press portion 320 in the middle thereof and a pair of second retention portions 321 at the two sides of the second press portion 320. When the second load lever 3 is assembled to the stiffener 2 and in a closed position, the pair of second retention portions 32 interlocks with the pair of second holding portions 220, the second stop portion 322 is thicker than the second retention portion 321 to prevent the horizontal movement of the second load lever 3. Thus, the second load lever 3 is securely positioned on the stiffener 2.

Figure 3:
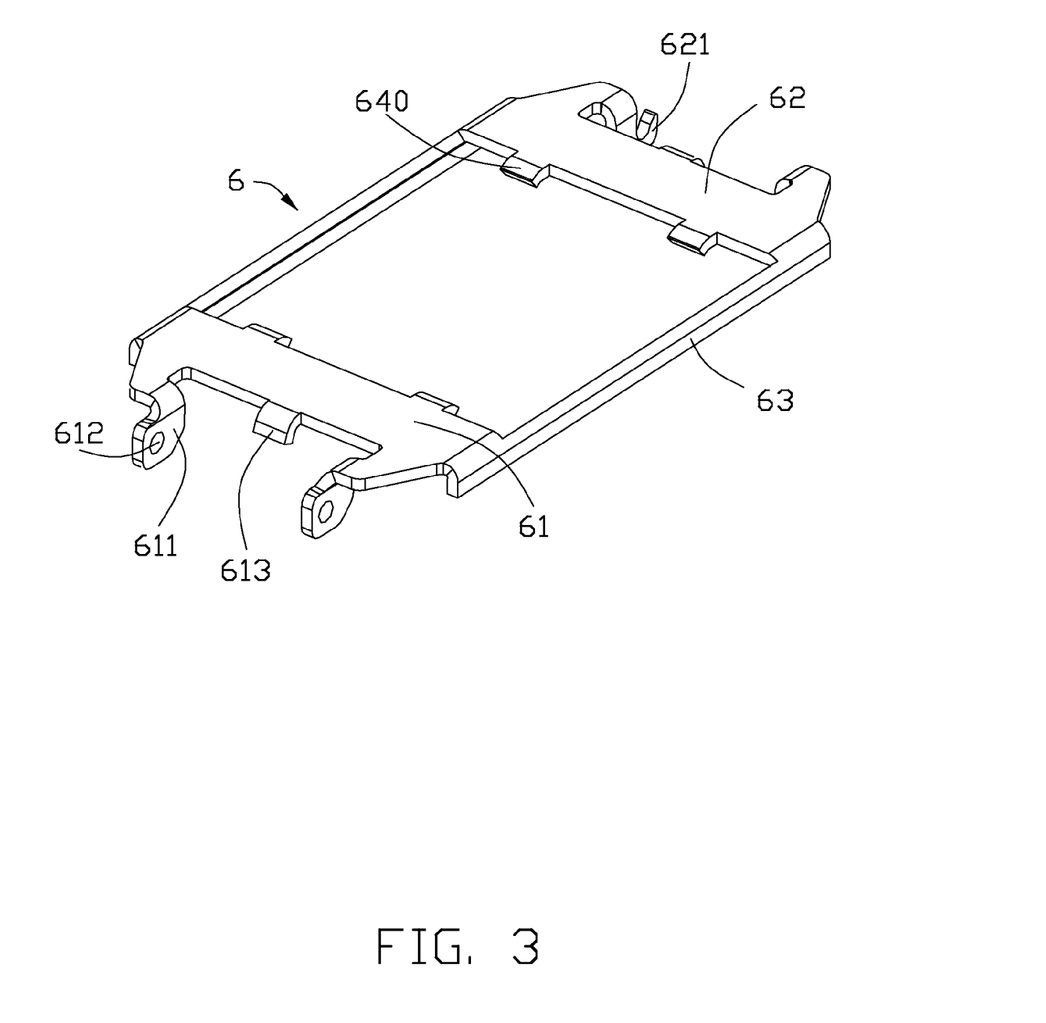
FIG. 3 is an isometric view of the load plate of the electrical connector assembly shown in FIG. 2.

The cover 6 comprises a front end 61, a rear end 62 and a pair of side portions 63 connecting the front end 61 and the rear end 62. The front end 61, the rear end 62 and the side portions 63 form a space 64 to permit the CPU 5 going through. Both of the front end 61 and the rear end 62 define a pair of engage portions 640 extending into the space 64 for pressing on the CPU 5 and a restrict portion 613 extending outwardly. The restrict portions 613 locates on the outside of the insulative housing 1 to guide the cover 6 being assembled to the insulative housing 1. The front end 61 comprises a pair of retention portions 611 extending from the two ends of the front end 61. Each of the retention portions 611 defines a through hole 612. The second operation portion 31 of the second load lever 3 goes through the through holes 612 to position the cover 6 on the second load lever 3. The rear end 62 comprises a pair of tongue portions 621 extending outwardly to be pressed by the first operation portion 41 of the first load lever 4.

The CPU 5 comprises a body portion 50, a first step portion 51 extending upwardly from the body portion 50, a second step portion 52 extending upwardly from the first step portion 51 and a plurality of conductive contacts 53 locating on the two sides of the first step portion 51. The cable connector assembly 7 comprises a cable connector 71 assembled to the CPU 5 and a cable 72 assembled to the cable connector 71. The electrical path between the cable 72 and the CPU 5 is established by the cable connector 71.

Figure 4:
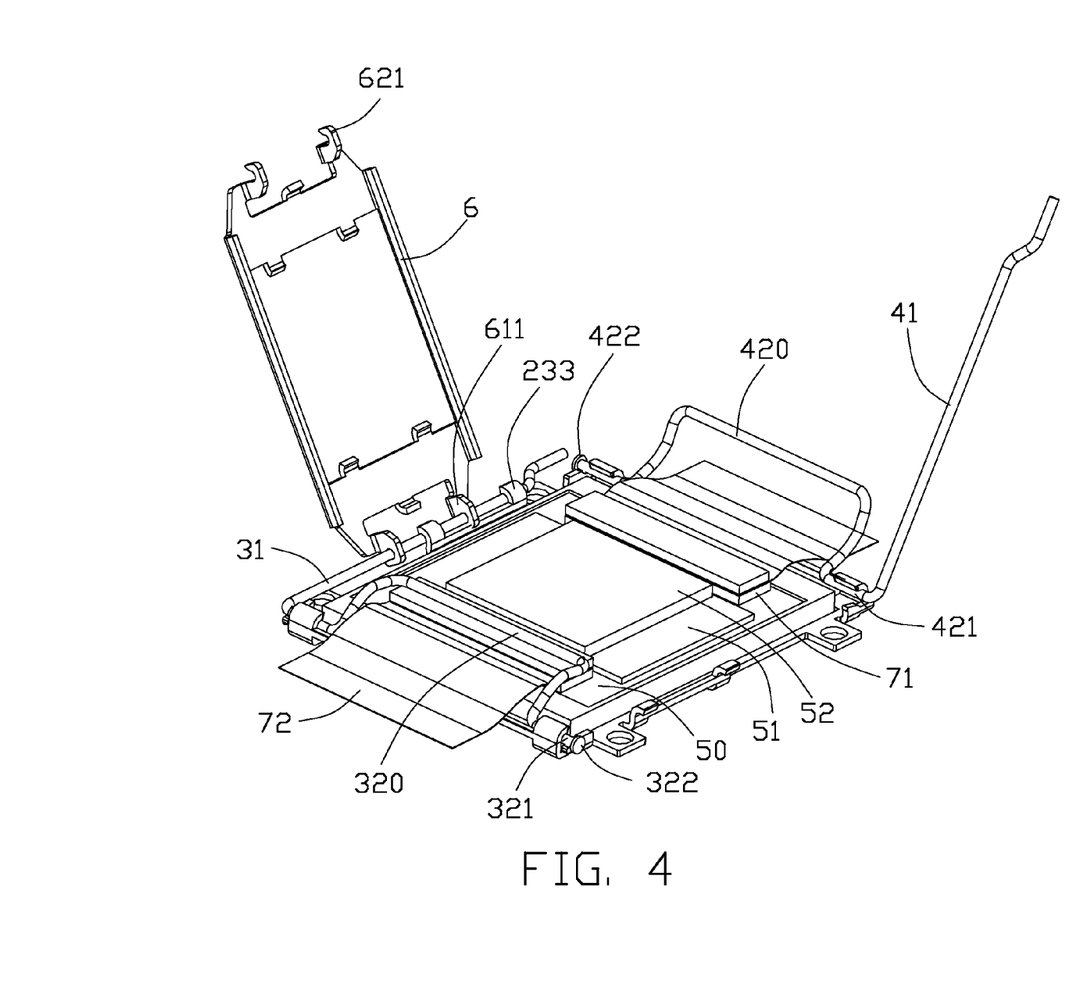
FIG. 4 is an assembled view of the electrical connector assembly shown in FIG. 2, shown both of the load plate and the first load lever are in an open position.
Figure 5:
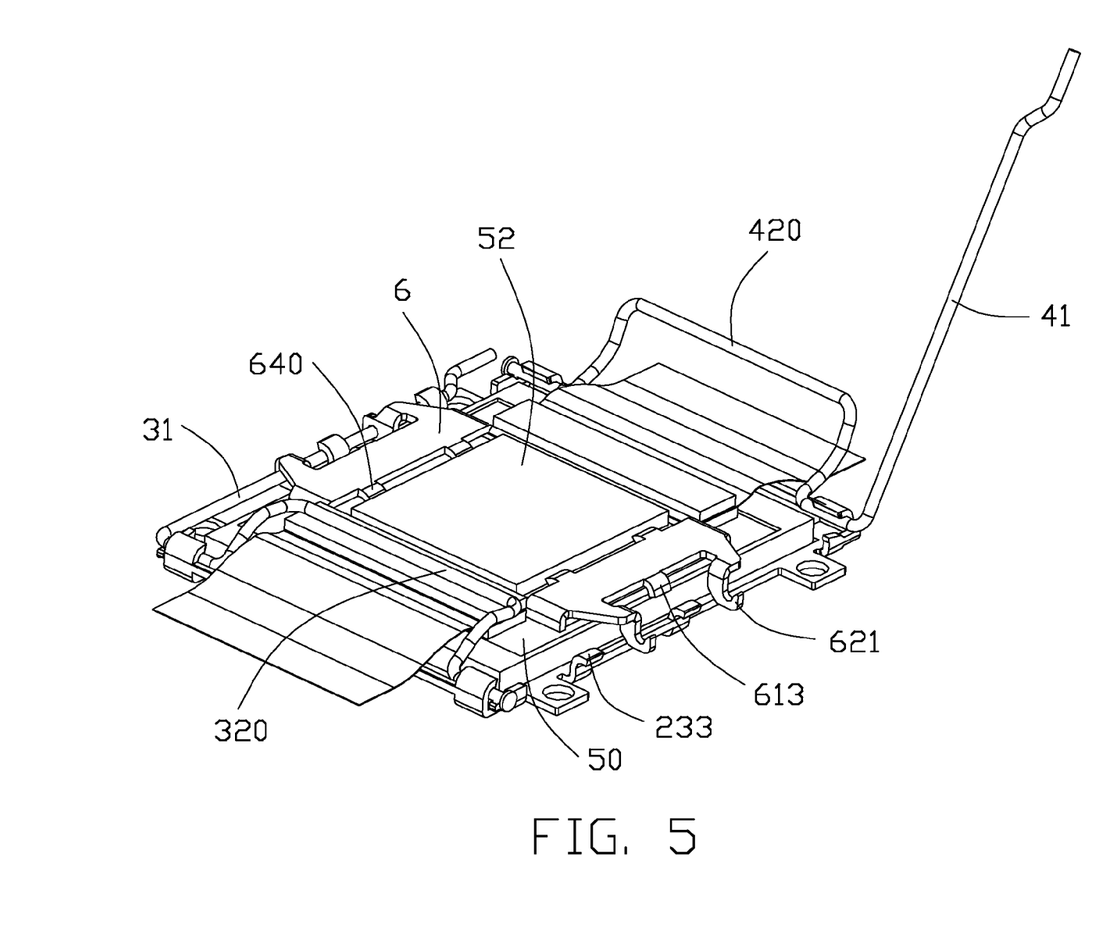
FIG. 5 is an assembled view of the electrical connector assembly shown in FIG. 2, shown the load plate in a closed poison and the first load lever in an open position.
Figure 6:
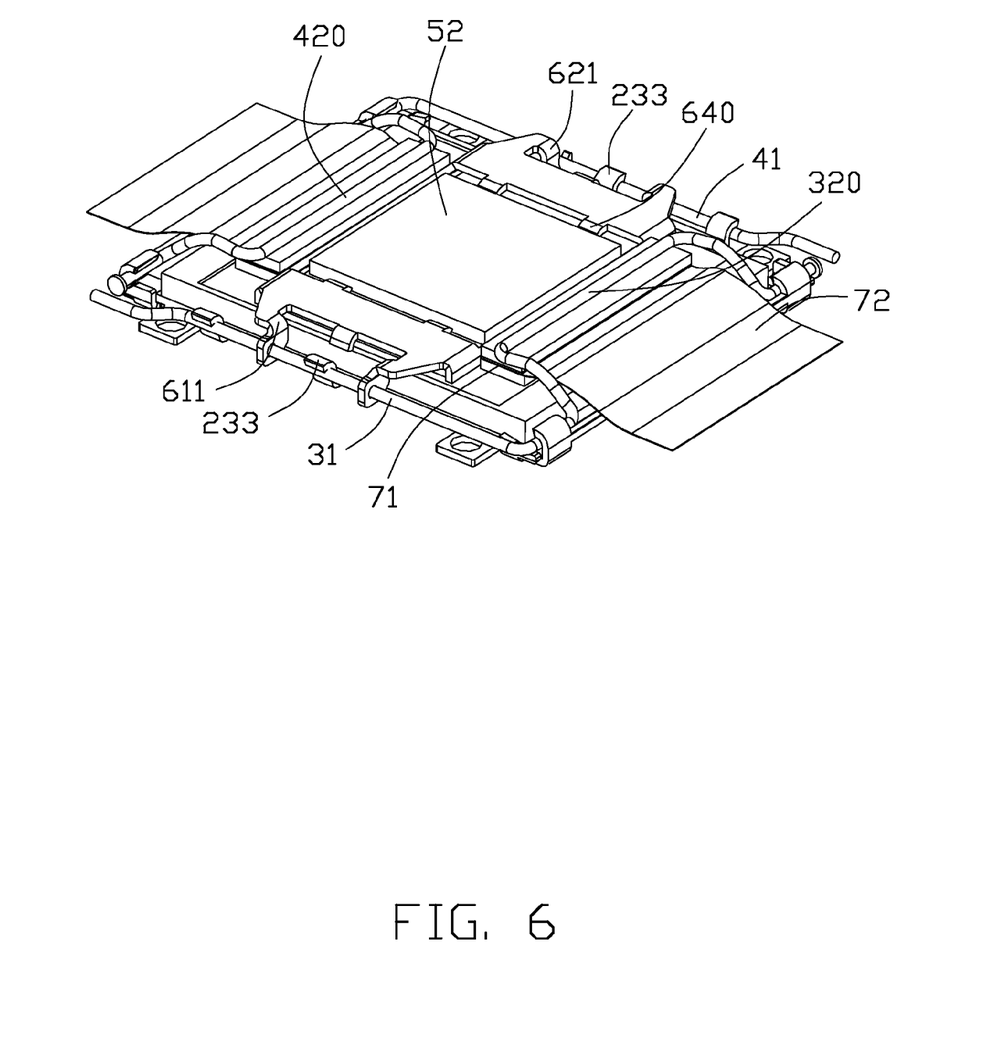
FIG. 6 is an assembled view of the electrical connector assembly shown in FIG. 2, shown both of the load plate and the first load lever are in a closed position.

Referring to FIGS. 4-6, when the electrical connector 100 is assembled, the stiffener 2 surrounds the insulative housing 1, the first load lever 4 is assembled to the first end 21 of the stiffener 2, the second load lever 3 is assembled to the second end 22, the cover 6 is assembled to the second load lever 3. Now introduce the operation step to assemble the CPU 5 to the electrical connector. First, assemble the cable connector assembly 7 to the CPU 5 and the CPU 5 is assembled to the electrical connector; second, rotate the second load lever 3 to make the second operation portion 31 interlock with the interlock portions 233 of the stiffener 2, the second press portion 320 presses on the cable 72; third, rotate the cover 6 to make it press on the CPU 5; third, rotate the first load lever 4 to make the first operation portion 41 interlock with the interlock portions 233 and the hook portions 621, make the cover 6 press on the CPU 5 tightly.

The first press portion 420 of the first load lever 4 and the second press portion 320 of the second load lever 3 press on the cable 72 to make a robust electrical connection between the cable 72 and the CPU 5. The side portions 63 of the cover 6 press on the body portion 51 of the CPU 5 and the engage portions 640 of the cover 6 press on the second step portion 52 of the CPU 5 to make a robust electrical connection between the CPU 5 and the contacts 10 received in the insulative housing 1. The first operation portion 41 of the first load lever 4 presses on the tongue portions 621 of the cover 6 to make the cover 6 press the CPU 5 tightly. The interlock portion 233 locates in the middle of the pair of retention portions 611 to make the side portions 63 of the cover 6 being assembled between the cable 72 and the first step 51 of the CPU 5 accurately.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector assembly, comprising:
   an electrical connector;
   a CPU assembled to the electrical connector; and
   a pair of cable connector assembles assembled to two opposite sides of the CPU and each of the cable connector assembles comprising a cable connector assembled to the CPU and a cable assembled to the cable connector; wherein
   the electrical connector comprising a first load lever with a first press portion pressing one of the cables and a second load lever with a second press portion pressing the other of the cables.

2. The electrical connector assembly as claimed in claim 1, wherein the second load lever comprises a second operation portion and a second locating portion connecting with the second operation portion, the second press portion locates on a middle of the second locating portion.

3. The electrical connector assembly as claimed in claim 2, wherein the electrical connector assembly further comprises a cover pivotally assembling to the second operation portion of the second load lever and pressed by the second load lever.

4. The electrical connector assembly as claimed in claim 3, wherein the first load lever comprises a first operation portion and a first locating portion connecting with the first operation portion, the first press portion locates on the middle of the first locating portion.

5. The electrical connector assembly as claimed in claim 3, wherein the cover comprises a front end, a rear end and a pair of side portions connecting the front end and the rear end, the side portions press on the CPU.

6. The electrical connector assembly as claimed in claim 5, wherein both of the front end and the rear end define a pair of engage portions for pressing on the CPU.

7. The electrical connector assembly as claimed in claim 5, wherein the front end comprises a retention portion extending from the front end to be assembled to the second operation portion of the second load lever.

8. The electrical connector assembly as claimed in claim 7, wherein the retention portion defines a through hole, the second operation portion of the second load lever goes through the through hole to position the cover on the second load lever.

9. The electrical connector assembly as claimed in claim 5, wherein the rear end comprises a tongue portion extending outwardly to be pressed by the first operation portion of the first load lever.

10. The electrical connector assembly as claimed in claim 1, wherein the electrical connector comprises an insulative housing with a plurality of contacts received therein and a stiffener surrounding the insulative housing, the first load lever and the second load lever locates on the two opposite ends of the stiffener.

11. An electrical connector for electrically connecting a CPU with a printed circuit board, comprising:
 a housing assembly with a plurality of contacts received therein;
 a first load lever and a second load lever located on two opposite ends of the housing assembly, the first load lever comprising a first operation portion, a first locating portion connecting with the first operation portion and a first press portion locating on a middle of the first locating portion, the second load lever comprising a second operation portion, a second locating portion connecting with the second operation portion and a second press portion locating on a middle of the second locating portion; and
 a cover assembled to the second operation portion of the second load lever and pressed by the second operation portion of the second load lever.

12. The electrical connector as claimed in claim 11, wherein the cover comprises a front end, a rear end and a pair of side portions connecting the front end and the rear end for pressing on the CPU.

13. The electrical connector as claimed in claim 12, wherein both of the front end and the rear end define a pair of engage portions for pressing on the CPU.

14. The electrical connector as claimed in claim 12, wherein the front end comprises a retention portion extending from the front end to be assembled to the second operation portion of the second load lever.

15. The electrical connector as claimed in claim 14, wherein the retention portion defines a through hole, the second operation portion of the second load lever goes through the through hole to position the cover on the second load lever.

16. The electrical connector as claimed in claim 15, wherein the rear end comprises a tongue portion extending outwardly to be pressed by the first operation portion of the first load lever.

17. An electrical connector assembly for use with a CPU (Central Processing Unit) having at least a cable detachably coupling thereon, comprising:
 an electrical connector including an insulative housing with a plurality of contacts thereof and defining a receiving cavity therein for receiving said CPU;
 a load plate located upon the housing for imposing downward force upon the CPU which is adapted to be sandwiched between the housing and the load plate;
 at least one load lever pivotally arranged with regard to the housing; wherein said load lever including a first side for downwardly pressing the load plate for facilitating electrical and mechanical connection between the CPU and the contacts, and further including a second side for enhancing coupling between the CPU and the cable.

18. The electrical connector assembly as claimed in claim 17, wherein the first side is perpendicular to the second side, and the second side defining a pivot axis of said load lever.

19. The electrical connector assembly as claimed in claim 17, further including another load lever pivotally arranged with regard to the housing, wherein said another load lever includes another first side located parallel to said first side of said load lever and pressing downwardly the load plate, and further includes another second side extending parallel to said second side of said load lever and defining another pivotal axis of said another load lever.

20. The electrical connector assembly as claimed in claim 17, wherein the load plate is constantly assembled to the first side in a pivotal manner, and the first side defines a pivotal axis thereof for pivotal movement of said load plate relative to the load lever.

* * * * *